US012768034B2

(12) United States Patent
Ly et al.

(10) Patent No.: US 12,768,034 B2
(45) Date of Patent: Oct. 20, 2026

(54) METHOD FOR DIRECT FORMATION OF ORIGAMI 3D GRAPHENE ON COPPER FOIL USING CHEMICAL VAPOR DEPOSITION

(71) Applicant: CITY UNIVERSITY OF HONG KONG, Kowloon (HK)

(72) Inventors: Thuc Hue Ly, Kowloon (HK); Quoc Huy Thi, Kowloon (HK); Haijun Liu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 328 days.

(21) Appl. No.: 18/446,099

(22) Filed: Aug. 8, 2023

(65) Prior Publication Data

US 2024/0052481 A1 Feb. 15, 2024

Related U.S. Application Data

(60) Provisional application No. 63/396,445, filed on Aug. 9, 2022.

(51) Int. Cl.
*C23C 16/26* (2006.01)
*C23C 16/44* (2006.01)
*C23C 16/46* (2006.01)

(52) U.S. Cl.
CPC .......... *C23C 16/26* (2013.01); *C23C 16/4408* (2013.01); *C23C 16/463* (2013.01)

(58) Field of Classification Search
None
See application file for complete search history.

(56) References Cited

U.S. PATENT DOCUMENTS

2012/0196074 A1* 8/2012 Ago .......................... B82Y 40/00 977/734
2022/0081300 A1* 3/2022 Gao .......................... C23C 16/52

FOREIGN PATENT DOCUMENTS

GB 2530974 A * 4/2016 ........... C01B 32/194

OTHER PUBLICATIONS

Lin et al. Synthesis of Graphene by CVD and its Nitrogen-plasma Treatment for Electrodes in Electrochemical Capacitor: Significance of Cooling and Plasma Conditions. Electrochemistry, 84(7), 506-510 (2016) (Year: 2016).*

* cited by examiner

*Primary Examiner* — Jose I Hernandez-Kenney
(74) *Attorney, Agent, or Firm* — Conley Rose, P.C.; Michael W. Piper; Gayatry Nair

(57) ABSTRACT

Disclosed herein is a method of forming origami 3-dimensional (3D) graphene on a substrate. The method includes steps of, (a) placing the substrate in a reaction chamber; (b) purging the reaction chamber with a flow of a carry gas; (c) providing a flow of hydrogen along with the carry gas into the reaction chamber; (d) elevating the temperature of the substrate tin the reaction chamber to a level that is close to its melting point; (e) providing a flow of a precursor gas to the reaction chamber for a period of time to deposit a flat graphene layer onto the substrate; and (f) cooling the substrate of step (e) to ambient temperature thereby transforming the flat graphene layer into the origami 3D graphene.

11 Claims, No Drawings

METHOD FOR DIRECT FORMATION OF ORIGAMI 3D GRAPHENE ON COPPER FOIL USING CHEMICAL VAPOR DEPOSITION

CROSS-REFERENCE TO RELATED APPLICATIONS

This application claims priority and the benefit of U.S. Provisional Patent Application No. 63/396,445, filed Aug. 9, 2022, the entirety of which is incorporated herein by reference

BACKGROUND OF THE INVENTION

1. Field of the Invention

The present invention relates to methods of forming graphene; and more particularly, to methods for forming origami three-dimensional (3D) graphene with properties equivalent to those formed by conventional methods.

2. Description of Related Art

Two-dimensional (2D) materials are attractive areas of academic and industrial research for their unprecedented, newly discovered properties. 2D materials can be prepared by mechanical exfoliation, solvothermal reaction, or chemical/physical deposition. Among all these methods, chemical vapor deposition (CVD) is the most promising strategy for preparing 2D materials with high yield and high quality.

A traditional art origami, which folds the 2D paper sheets to 3D structures, offers a new approach for architecting and manufacturing 2D materials and integrated devices. Superiorly, the graphene origami 3D structures have fascinating properties like tunable thermal expansion, anomalous magnetophotoelectric effect and exceptional high sensitivity. However, the existing CVD methods could only produce random morphology of graphene growth on copper foil. To date, the origami 3D graphene can be locally created using scanning probe microscope, or by self-folding 2D graphene sheet controlled by complicated chemical functionalization. These methods are laboratory scale limited and may damage the graphene sheet.

Therefore, there exist in the related art a need of an improved method for directly forming 3D graphene on substrates, in which the method is easy to use, scalable, and efficient; and the thus produced 3D graphene have properties similar to that formed by conventional CVD methods.

SUMMARY

Embodiments of the present disclosure relate to methods of forming origami 3D graphene on a substrate. The method includes steps of:

(a) placing the substrate in a reaction chamber;

(b) purging the reaction chamber with a flow of a carry gas;

(c) introducing a flow of hydrogen into the reaction chamber of step (b) in the flow of the carry gas;

(d) elevating the temperature of the substrate in the reaction chamber to a level that is close to its melting point;

(e) introducing a flow of a precursor gas to the reaction chamber for a period of time to deposit a flat graphene layer onto the substrate; and (f) cooling the temperature of the substrate in step (e) to ambient temperature in the flow of the carry gas thereby transforming the flat graphene layer into the origami 3D graphene.

Examples of the substrate suitable for use in the present method include, but are not limited to, copper, nickel, platinum and an alloy thereof. In some preferred embodiments of the present disclosure, the substrate is made of copper. In other embodiments, the substrate is made of an alloy of copper and nickel. Additionally, the substrate has a thickness from about 0.025 mm to about 0.1 mm.

Examples of the carry gas suitable for use in step (b) of the present method include, but are not limited to, argon and nitrogen. In some embodiments, in, the reaction chamber is purged by a flow of argon. In other embodiments, in step (b), the reaction chamber is purged by a flow of nitrogen.

According to embodiments of the present disclosure, in step (c), a flow of hydrogen is provided along with the carry gas at a volume ratio of about 1:10 to about 1:200 into the reaction chamber. In some embodiments, a flow of hydrogen is provided along with the carry gas at a volume ratio of about 1:200. In other embodiments, a flow of hydrogen is provided along with the carry gas at a volume ratio of about 1:40.

According to embodiments of the present disclosure, in step (d), the substrate in the reaction chamber is heated to a temperature of about 1,000° C. to about 1,100° C. In some embodiments, the substrate is heated to about 1,080° C. In other embodiments, the substrate is heated to about 1,085° C.

Examples of the precursor gas suitable for use in step (e) of the present method include, but are not limited to, methane, ethylene, or acetylene. In some embodiments, the precursor gas is methane. In other embodiments, the precursor gas is ethylene.

According to embodiments of the present disclosure, in step (e), the precursor gas and the hydrogen are provided to the reaction chamber at a volume ratio of about 1:50 to about 50:1 for a period of about 10-60 min thereby results in the deposition of a flat graphene layer on the substrate. In some embodiments, the precursor gas and the hydrogen are provided to the reaction chamber at the volume ratio of about 1:5 for about 45 min to deposit the flat graphene layer on to the substrate. In other embodiments, the precursor gas and the hydrogen are provided to the reaction chamber at the volume ratio of about 1:5 for about 30 min to deposit the flat graphene layer on to the substrate. In further embodiments, the precursor gas and the hydrogen are provided to the reaction chamber at the volume ratio of about 3:5 for about 30 min to deposit the flat graphene layer on to the substrate.

According to embodiments of the present disclosure, in step (f), the substrate is cooled to ambient temperature at a rate of about 2-6° C./min thereby transforming the flat graphene layer of step (e) into the origami 3D graphene on the substrate. In some embodiments, the substrate is cooled at the rate of about 2° C./min. In other embodiments, the substrate is cooled at the rate of about 4° C./min.

In all embodiments of the present disclosure, the origami 3D graphene thus formed has periodic wrinkle pattern composed of triangular or rectangular units and properties equivalent to those produced by conventional methods.

Other and further embodiments of the present disclosure are described in more detail below.

DETAILED DESCRIPTION

Detailed descriptions and technical contents of the present disclosure are illustrated below. However, it is to be understood that the descriptions disclosed herein are merely illustrative and exemplary and not intended to limit the scope of the present disclosure.

Embodiments of the present disclosure include novel methods for direct formation of origami 3D graphene on a substrate. Methods in accordance with embodiments of the present disclosure are advantageously simple, easy-to-use, and could produce graphene origami 3D structure, which possesses tunable thermal expansion property, anomalous magnetophotoelectric effect and exceptional high sensitivity.

The present disclosure aims at providing a method of forming origami 3D graphene on a substrate. The method includes steps of, (a) placing the substrate in a reaction chamber;

(b) purging the reaction chamber with a flow of a carry gas;

(c) providing a flow of hydrogen along with the carry gas into the reaction chamber;

(d) elevating the temperature of the substrate in the reaction chamber to a level that is close to its melting point;

(e) providing a flow of a precursor gas to the reaction chamber for a period of time to deposit a flat graphene layer onto the substrate; and (f) cooling the substrate of step (e) to ambient temperature thereby transforming the flat graphene layer into the origami 3D graphene.

The present method commences from loading a substrate into a reaction chamber, such as a tube furnace (step (a)). Examples of the substrate suitable for use in the present method include, but are not limited to, copper, nickel, platinum and an alloy thereof. In some preferred embodiments of the present disclosure, a copper foil about 1 to 10 cm wide, 1 to 10 cm long and a thickness ranging from about 25 μm to about 100 μm is placed into a tube furnace. In other embodiments, an alloy of copper and nickel about 1 to 10 cm wide, 1 to 10 cm long and a thickness ranging from about 25 μm to about 100 μm is placed into a tube furnace.

To the purpose of forming a film of graphene, the reaction chamber (i.e., the tube furnace) is preferably free of oxygen, accordingly, the reaction chamber may be evacuated or purged with an inert gas to remove any residual air therein. According to preferred embodiments of the present disclosure, the reaction chamber is purged with a flow of a carry gas (step (b)). Examples of the carry gas suitable for use in the present method include, but are not limited to, argon and nitrogen. In some embodiments, the reaction chamber is purged with argon at a flow rate of about 200 to 1,000 sccm, such as 200, 300, 400, 500, 600, 700, 800, 900 and 1,000 sccm. In other embodiments, the reaction chamber is purged with nitrogen at a flow rate of about 1,000 sccm.

Then, a flow of hydrogen is introduced into the reaction chamber along with the carry gas (e.g., argon) (step (c)). Preferably, hydrogen is introduced into the reaction chamber at a flow rate of about 1-10 sccm, such as 1, 2, 3, 4, 5, 6, 7, 8, 9 and 10 sccm; while argon is flowing into the reaction chamber at a rate of about 200 to 1,000 sccm into the reaction chamber, such as 200, 300, 400, 500, 600, 700, 800, 900 and 1,000 sccm. In some preferred embodiments, hydrogen is introduced into the reaction chamber at a flow rate of 5 sccm along with argon at a flow rate of about 1,000 sccm. In other embodiments, hydrogen is introduced into the reaction chamber at a flow rate of 5 sccm along with argon at a flow rate of about 200 sccm.

The temperature of the substrate in the reaction chamber is subsequently elevated to a level of about 1,000° C. to about 1,100° C. in the flow of hydrogen (step (d)). Preferably, the temperature of the substrate is elevated (e.g., via heating) to a range that is close to its melting point. According to preferred embodiments of the present disclosure, a copper foil is used as the substrate, thus, the temperature of the substrate is increased (e.g., via heating the reaction chamber) to a range that is close to the melting point of copper. In some embodiments, the temperature of the substrate is increased to about 1,080° C. In other embodiments, the temperature of the substrate is increased to about 1,085° C.

Once the temperature of the substrate has reached the level that is close to its melting point (e.g., about 1,000° C. to about 1,100° C. in this invention), a precursor gas is then introduced into the reaction chamber, which is now in the temperature that is close to the melting point of the substrate, for a period of about 10-60 min. Note that the precursor gas, which serves as the carbon source, becomes vaporized in the heated reaction chamber, and when the precursor gas vapor comes into contact with the heated substrate, a hydrocarbon layer (i.e., a graphene film) is deposited onto the substrate (step (e)). Examples of the precursor gas suitable for use in the present method include, but are not limited to, methane, ethylene, or acetylene. According to preferred embodiments of the present disclosure, methane is introduced into the reaction chamber at a flow rate of about 1 to 10 sccm for a period of about 10-60 min. In some examples, methane is introduced into the reaction chamber at a flow rate of 1 sccm for about 45 min to deposit the hydrocarbon layer on to the substrate. In other examples, methane is introduced into the reaction chamber at a flow rate of 1 sccm for about 30 min to deposit the hydrocarbon layer on to the substrate. In further examples, methane is introduced into the reaction chamber at a flow rate of 3 sccm for about 30 min to deposit the hydrocarbon layer on to the substrate.

Once the hydrocarbon layer (or the 2D graphene layer) is deposited, the substrate in the reaction chamber is cooled to ambient temperature thereby transforming the hydrocarbon layer into the desired origami 3D graphene on the substrate. Preferably, the substrate in the reaction chamber is cooled at a rate of about 2-6° C./min, such as 2, 3, 4, 5 and 6° C./min, until the temperature of the substrate has returned to ambient temperature of about 20-30° C. In some examples, the substrate is cooled at the rate of about 2° C./min. In other examples, the substrate is cooled at the rate of about 4° C./min.

According to embodiments of the present disclosure, the graphene thus formed has 3D structure, that is, periodic wrinkle pattern of triangular or rectangular units, in which the wavelength and height of these periodic units range from 200-750 nm and 5-30 nm. Further, the 3D graphene thus formed was stable in ambient condition with quality similar to that prepared by conventional methods.

The present invention will now be described more specifically with reference to the following embodiments, which are provided for the purpose of demonstration rather than limitation. While they are typically of those that might be used, other procedures, methodologies, or techniques known to those skilled in the art may alternatively be used.

EXAMPLES

Example 1

Placed a copper foil (5 cm (width)×5 cm (length)×75 μm (thickness)) into a quartz stage in the center of a CVD furnace. Then, a flow of argon was blown into the CVD furnace to fully purge the air out of the furnace. A flow of hydrogen was then injected into the purged CVD furnace. Adjusted the flow rate of the argon and the hydrogen to 1,000 sccm and 5 sccm, respectively, and set the quartz tube furnace heating program for chemical reaction. After the temperature reached 1080° C., a flow of methane, which served as a precursor gas, was injected into the quartz tube furnace, in which the argon, the hydrogen, and methane were present at a volume ratio of 1,000:5:1. After 45 minutes, turned off the flows of methane and the hydrogen, as well as the heating program. Then, cooled the CVD furnace to room temperature with an average cooling rate of 2° C./min to produce origami 3D graphene on copper foil.

Example 2

Placed a copper foil (1 cm (width)×1 cm (length)×100 μm (thickness)) into a quartz stage in the center of a CVD furnace. Then, a flow of argon was blown into the CVD furnace to fully purge the air out of the furnace. A flow of hydrogen was then injected into the purged CVD furnace. Adjusted the flow rate of the argon and the hydrogen to 1,000 sccm and 5 sccm, respectively, and set the quartz tube furnace heating program for chemical reaction. After the temperature reached 1085° C., a flow of methane, which served as a precursor gas, was injected into the quartz tube furnace, in which the argon, the hydrogen, and methane were present at a volume ratio of 1,000:5:1. After 30 minutes, turned off the flows of methane and the hydrogen, as well as the heating program. Then, cooled the CVD furnace to room temperature with an average cooling rate of 2° C./min to produce origami 3D graphene on copper foil.

Example 3

Placed a copper foil (10 cm (width)×10 cm (length)×25 μm (thickness)) into a quartz stage in the center of a CVD furnace. Then, a flow of argon was blown into the CVD furnace to fully purge the air out of the furnace. A flow of hydrogen was then injected into the purged CVD furnace. Adjusted the flow rate of the argon and the hydrogen to 1,000 sccm and 5 sccm, respectively, and set the quartz tube furnace heating program for chemical reaction. After the temperature reached 1085° C., a flow of methane, which served as a precursor gas, was injected into the quartz tube furnace, in which the argon, the hydrogen, and methane were present at a volume ratio of 1,000:5:3. After 30 minutes, turned off the flows of methane and the hydrogen, as well as the heating program. Then, cooled the CVD furnace to room temperature with an average cooling rate of 4° C./min to produce origami 3D graphene on copper foil.

It was found that the 3D graphene independently formed on copper foil according to procedures described in any one of Examples 1 to 3 possessed periodic wrinkle pattern of triangular or rectangular units; in which the wavelength and height of these periodic units ranged from 200-750 nm and 5-30 nm (data not shown). Further, the 3D graphene thus formed was stable in ambient condition with quality similar to that prepared by conventional methods (data not shown).

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of the present disclosure.

What is claimed is:

1. A method of directly forming origami 3-dimensional (3D) graphene on a substrate comprising:

(a) placing the substrate in a reaction chamber;

(b) purging the reaction chamber with a flow of a carry gas;

(c) introducing a flow of hydrogen into the flow of the carry gas in the reaction chamber;

(d) elevating the temperature of the reaction chamber to a level that is about the melting point of the substrate;

(e) introducing a flow of a precursor gas into the reaction chamber for a period of time to deposit a flat graphene layer onto the substrate; and (f) cooling the substrate having the flat graphene layer deposited thereon to ambient temperature at a rate of about 2-6° C./min thereby transforming the flat graphene layer into the origami 3D graphene;

wherein, the substrate is made of copper;

the carry gas, the hydrogen, and the flow of the precursor gas are provided to the reaction chamber at a volume ratio of about 1000:5:1 to 1000:5:3;

the origami 3D graphene has periodic wrinkle pattern composed of triangular or rectangular units; and the triangular or rectangular units have a height between 5-30 nm and a wavelength between 200-750 nm.

2. The method of claim 1, wherein the substrate has a thickness from about 0.025 mm to about 0.1 mm.

3. The method of claim 1, wherein in step (c), the carry gas is argon or nitrogen.

4. The method of claim 3, wherein the carry gas is argon.

5. The method of claim 1, wherein in step (d), the substrate is heated to about 1,000° C. to 1,100° C.

6. The method of claim 5, wherein the substrate is heated to about 1,080° C.

7. The method of claim 1, wherein in step (e), the precursor gas is methane, ethylene, or acetylene.

8. The method of claim 7, wherein the precursor gas is provided to the reaction chamber for the period of time of about 10-60 min.

9. The method of claim 8, wherein the precursor gas is provided to the reaction chamber for the period of time of about 30-45 min.

10. The method of claim 1, wherein the substrate is cooled at the rate of about 2° C./min.

11. The method of claim 1, wherein the substrate is cooled at the rate of about 4° C./min.

* * * * *